United States Patent
Shimura et al.

(10) Patent No.: US 10,460,874 B2
(45) Date of Patent: Oct. 29, 2019

(54) ELECTRONIC COMPONENT WITH METAL TERMINALS

(71) Applicant: TAIYO YUDEN CO., LTD., Chuo-ku, Tokyo (JP)

(72) Inventors: Tetsuo Shimura, Takasaki (JP); Yosuke Nakada, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/900,502

(22) Filed: Feb. 20, 2018

(65) Prior Publication Data

US 2018/0240595 A1   Aug. 23, 2018

(30) Foreign Application Priority Data

Feb. 22, 2017 (JP) .................. 2017-030744

(51) Int. Cl.
| | |
|---|---|
| *H01G 4/228* | (2006.01) |
| *H01G 4/30* | (2006.01) |
| *H01G 2/06* | (2006.01) |
| *H01G 4/232* | (2006.01) |
| *H05K 1/18* | (2006.01) |
| *H01G 4/12* | (2006.01) |

(52) U.S. Cl.
CPC .............. *H01G 4/228* (2013.01); *H01G 2/06* (2013.01); *H01G 4/232* (2013.01); *H01G 4/30* (2013.01); *H05K 1/181* (2013.01); *H01G 4/12* (2013.01)

(58) Field of Classification Search
CPC ............................... H01G 4/228; H01G 4/232
See application file for complete search history.

(56) References Cited

U.S. PATENT DOCUMENTS

| | | | | |
|---|---|---|---|---|
| 6,903,920 B1 * | 6/2005 | Prymak | .................. | H01G 2/065 361/306.1 |
| 8,830,654 B2 * | 9/2014 | Haruki | .................. | H01G 4/005 361/306.1 |

FOREIGN PATENT DOCUMENTS

| | | | |
|---|---|---|---|
| JP | 2000306764 A | | 11/2000 |
| JP | 2002231569 A | | 8/2002 |
| JP | 2004288847 A | | 10/2004 |
| JP | 2012094784 A | * | 5/2012 |
| WO | WO-2018146990 A1 | * | 8/2018 |

* cited by examiner

*Primary Examiner* — Eric W Thomas

(74) *Attorney, Agent, or Firm* — Law Office of Katsuhiro Arai

(57) ABSTRACT

In an embodiment, an electronic component with metal terminals includes: an electronic component 10 having a component body 11 of roughly rectangular solid shape, as well as external electrodes 12 provided on the ends thereof in the first direction d1, respectively; and metal terminals 20 provided in sets of two on each external electrode 12. Each metal terminal 20 has a first planar part 21 and a second planar part 23 oriented differently from the first planar part 21; the first planar part 21 is connected to each external electrode 12 in a manner facing one face of the component body 11; and the second planar part 23 is positioned in a manner facing at least partially, across a clearance 24, another face adjoining the one face of the component body 11, while being fixed to the component body 11 by an adhesive 40 provided in the clearance 24.

9 Claims, 6 Drawing Sheets

| SAMPLE | D3[40] | D3[40]/D1[10] | Vibration Resistance Failure |
|---|---|---|---|
| No. 1 | 0.35mm | 0.025 | 1/100 |
| No. 2 | 0.33mm | 0.024 | 0/100 |
| No. 3 | 0.30mm | 0.021 | 0/100 |
| No. 4 | 0.25mm | 0.018 | 0/100 |
| No. 5 | 0.20mm | 0.014 | 0/100 |
| No. 6 | 0.15mm | 0.011 | 0/100 |
| No. 7 | 0.10mm | 0.007 | 0/100 |
| No. 8 | 0.05mm | 0.004 | 0/100 |
| No. 9 | 0.03mm | 0.002 | 0/100 |
| No. 10 | 0.01mm | 0.001 | 2/100 |
| * No. 11 | 0.25mm | 0.014 | 34/100 |
| * No. 12 | 0.10mm | 0.007 | 21/100 |

ELECTRONIC COMPONENT WITH METAL TERMINALS

BACKGROUND

Field of the Invention

The present invention relates to an electronic component with metal terminals, constituted by an electronic component and metal terminals provided thereon.

Description of the Related Art

An electronic component with metal terminals, such as any of the multilayer capacitors with metal terminals as disclosed in Patent Literatures 1 to 3 mentioned below, has a structure whereby one ends of the metal terminals are connected to the external electrodes of the multilayer capacitor. Such multilayer capacitor with metal terminals is mounted on a circuit board by connecting the other ends of the metal terminals to the conductor pads on the circuit board using solder or other bonding material.

Incidentally, electronic components with metal terminals, including the aforementioned multilayer capacitors with metal terminals, are such that, in a mounted state, their mechanical strength is provided by the metal terminals. This means that, especially when an electronic component of large mass is used and vibration due to external force is applied to the electronic component, the resulting stress may concentrate on the metal terminals and consequently the metal terminals may separate from the conductor pads on the circuit board.

BACKGROUND ART LITERATURES

[Patent Literature 1] Japanese Patent Laid-open No. 2000-306764
[Patent Literature 2] Japanese Patent Laid-open No. 2002-231569
[Patent Literature 3] Japanese Patent Laid-open No. 2004-288847

SUMMARY

An object of the present invention is to provide an electronic component with metal terminals that allows drop in its vibration resistance to be minimized in a mounted state, even when an electronic component of large mass is used.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the electronic component with metal terminals pertaining to the present invention is an electronic component with metal terminals constituted by an electronic component and metal terminals provided thereon, wherein the electronic component has a component body of roughly rectangular solid shape that contains internal conductors, as well as external electrodes provided on the opposing ends of the component body, respectively; each of the metal terminals has a first planar part and a second planar part oriented differently from the first planar part; the first planar part of the metal terminal is connected to one of the external electrodes in a manner facing one face of the component body; and the second planar part of the metal terminal is positioned in such a way that it faces at least partially, across a clearance, another face adjoining the one face of the component body, while being fixed to the component body by adhesive provided in the clearance.

According to the electronic component with metal terminals pertaining to the present invention, drop in its vibration resistance can be minimized in a mounted state, even when an electronic component of large mass is used.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 5A is a front view of the electronic component shown in FIG. 1, while

DESCRIPTION OF THE SYMBOLS

Figure 1:
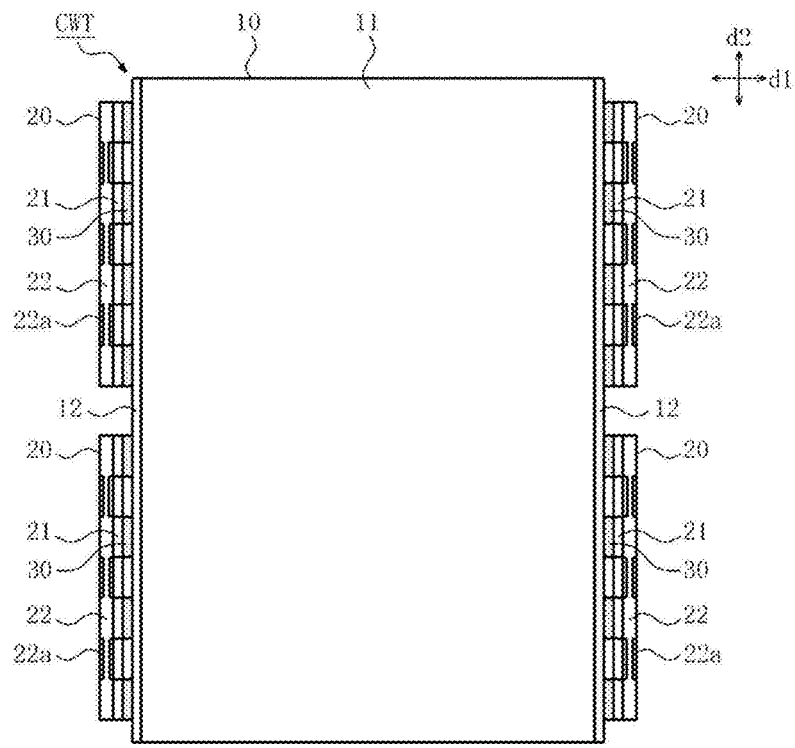
FIG. 1 is a plan view of an electronic component with metal terminals to which the present invention is applied.

CWT—Electronic component with metal terminals, 10—Electronic component, 11—Component body, 11a—Internal conductor, 12—External electrode, 20—Metal terminal, 21—First planar part, 22—Intermediate planar part, 22a—Through hole, 23—Second planar part, 24—Clearance, 30—Conductive bonding material, 40—Adhesive, 20-1—Metal terminal, 22-1—Intermediate planar part, 20-2—Metal terminal, 22-2—Intermediate planar part, 20-3—Metal terminal, 22-3—Intermediate planar part, 23-3—Second planar part.

DETAILED DESCRIPTION OF EMBODIMENTS

First, FIGS. 1 to 5 are used to explain the constitution of an electronic component with metal terminals CWT to which the present invention is applied. This electronic component with metal terminals CWT is constituted by an electronic component 10 and a total of four metal terminals 20 provided thereon, where the electronic component 10 is a multilayer capacitor.

In the following explanations, the direction in which two opposing faces of the capacitor body 11 of roughly rectangular solid shape are facing away from each other (corresponding to the lateral direction in FIG. 1) is denoted as "first direction d1," the direction in which other two opposing faces are facing away from each other (corresponding to the vertical direction in FIG. 1) is denoted as "second direction d2," and the direction in which the remaining two opposing faces are facing away from each other (corresponding to the vertical direction in FIG. 2) is denoted by "third direction d3," for the sake of convenience. Also, with respect to each constituent, the dimension along the first direction d1 is denoted as "first-direction dimension D1 [reference number of constituent]," the dimension along the second direction d2 is denoted as "second-direction dimension D2 [reference number of constituent]," and the dimension along the third direction d3 is denoted as "third-direction dimension D3 [reference number of constituent]."

The electronic component 10 has a component body 11 that constitutes a roughly rectangular solid shape, as well as external electrodes 12 provided at the ends of the component body 11 in the first direction d1, respectively. As reference, the first-direction dimension D1 [10], second-direction dimension D2 [10] and third-direction dimension D3 [10], of the electronic component 10 on which FIGS. 1 to 5 are based, are 14 mm, 19 mm and 4.5 mm, respectively.

It should be noted that, while the electronic component 10 shown in FIGS. 1 to 5 has the relationship of "Second-direction dimension D2 [10]>First-direction dimension D1 [10]>Third-direction dimension D3 [10]," it may have a different relationship, such as "D1 [10]=D2 [10]>D3 [10]" or "D1 [10]>D2 [10]>D3 [10]."

Figure 5A:
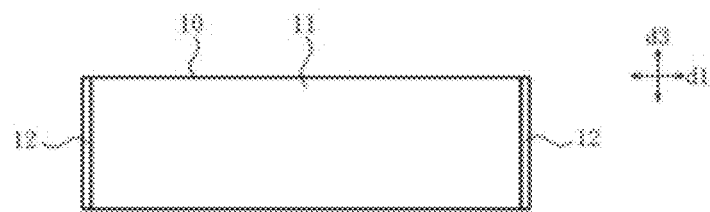
Figure 5B:
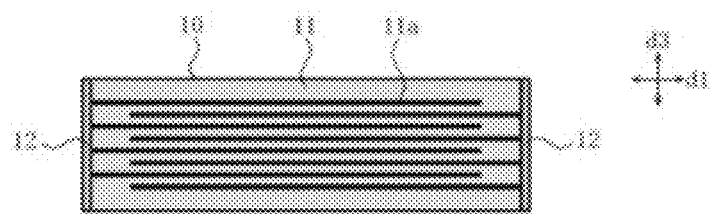
FIG. 5B is a longitudinal cross-sectional view of the electronic component shown in FIG. 5A.

The component body 11 is made of dielectric material and, as shown in FIG. 5B, contains multiple (eight in the figure) internal conductors (internal electrode layers) 11a of roughly rectangular shape that are not contacting each other in the third direction d3. Some of the multiple internal conductors 11a are connected to one external electrode 12, while the remainder of the multiple internal conductors 11a are connected to the other external electrode.

It should be noted that, while the external electrodes 12 shown in FIGS. 1 to 5 are formed in a manner covering the end faces of the component body 11 in the first direction d1, respectively (form based on single-face constitution), they may be formed differently, such as in a manner continuously covering the end faces in the first direction d1, parts of the end faces in the second direction d2, and parts of the end faces in the third direction d3, of the component body 11, respectively (form based on five-face constitution), or in a manner continuously covering the end faces in the first direction d1 and parts of the end faces in the third direction d3, of the component body 11, respectively (form based on three-face constitution).

For the primary constituent of the dielectric part of the component body 11, barium titanate, strontium titanate, calcium titanate, magnesium titanate, calcium zirconate, calcium zirconate titanate, barium zirconate, titanium oxide, etc., may be used in a favorable manner. Also, for the primary constituent of the internal conductor 11a, nickel, copper, palladium, platinum, silver, gold, or alloy thereof, etc., may be used in a favorable manner.

Although not illustrated, the external electrodes 12 may respectively adopt, in a favorable manner, a two-layer constitution comprising a base metal film contacting the component body 11 and a surface metal film contacting the exterior side of the base metal film, or a multi-layer constitution comprising these base metal film and surface metal film with at least one intermediate metal film provided in between.

In the aforementioned two-layer constitution or multi-layer constitution, the base metal film is formed by a baked metal film or plated metal film, for example, and for the primary constituent of this base metal film, nickel, copper, palladium, platinum, silver, gold, or alloy thereof, etc., may be used in a favorable manner. Also, the surface metal film is formed by a plated metal film, for example, and for the primary constituent of this surface metal film, copper, tin, palladium, gold, zinc, or alloy thereof, etc., may be used in a favorable manner. Furthermore, the intermediate metal film is formed by a plated metal film, for example, and for the primary constituent of this intermediate metal film, platinum, palladium, gold, copper, nickel, or alloy thereof, etc., may be used in a favorable manner.

The metal terminals 20 are provided in sets of two in the second direction d2 on the external electrodes 12 of the electronic component 10, with an interval between constituents of the sets. Each metal terminal 20 is formed by bending a metal plate of desired thickness (preferably 0.05 to 0.3 mm) constituted continuously by multiple (four in the figure) strip-shaped parts and a rectangular part, and it continuously has a first planar part 21, an intermediate planar part 22, and a second planar part 23.

The first planar part 21 of each metal terminal 20 is constituted by parts of the multiple strip-shaped parts, and facing an end face of the component body 11 in the first direction d1. Also, the second planar part 23 of each metal terminal 20 is constituted by a part of the rectangular part, and facing one end face (bottom face in FIG. 2) of the component body 11 in the third direction d3. Furthermore, the intermediate planar part 22 of each metal terminal 20 is constituted by the remainder of the multiple strip-shaped parts and the remainder of the rectangular part, where its exterior face forms an obtuse angle with the exterior face of the first planar part 21 and an acute angle with the exterior face of the second planar part 23. Furthermore, multiple (three in the figure, identical to the number of areas between the multiple strip-shaped parts) rectangular through holes 22a are formed near the second planar part 23 of the intermediate planar part 22, in a manner facing a clearance 24 mentioned below in the first direction d1.

Figure 2:
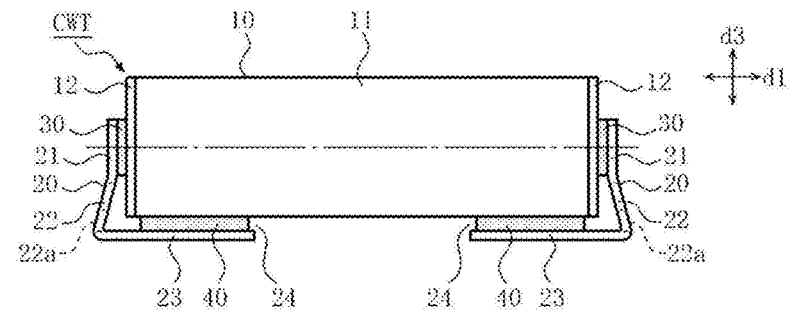
FIG. 2 is a front view of the electronic component with metal terminals shown in FIG. 1.
Figure 3:
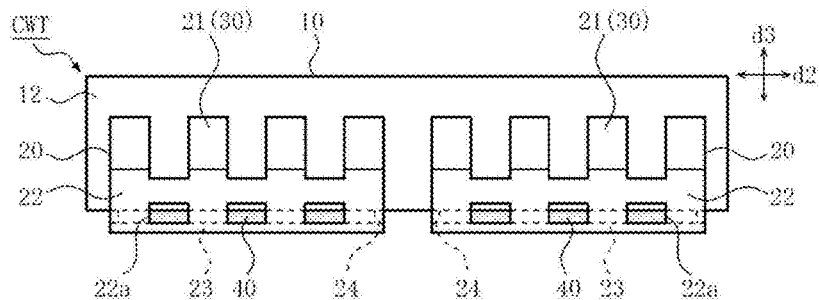
FIG. 3 is a right side view of the electronic component with metal terminals shown in FIG. 1.
Figure 4:
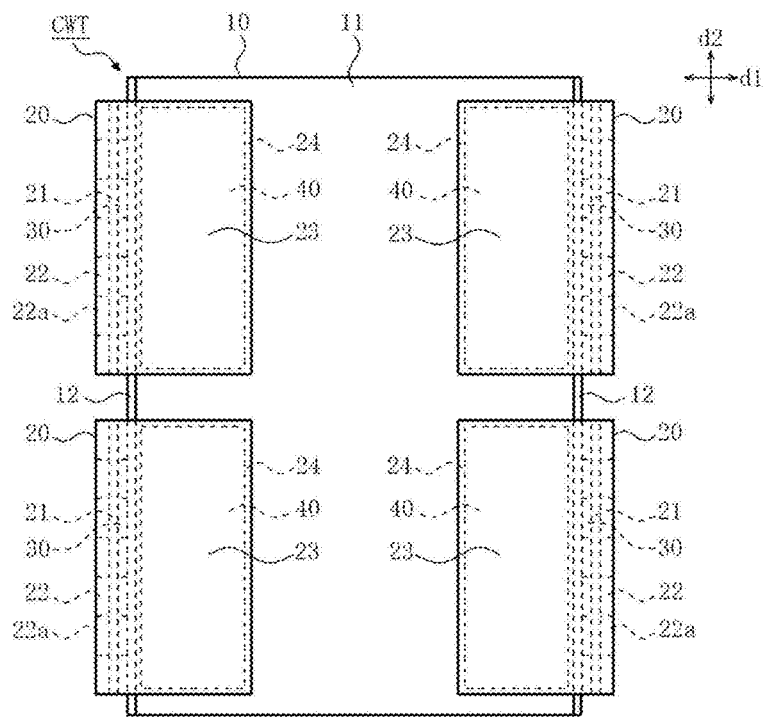
FIG. 4 is a bottom view of the electronic component with metal terminals shown in FIG. 1.

It should be noted that, while the exterior face of the intermediate planar part 22 shown in FIGS. 1 to 4, especially in FIG. 2, forms an angle of 165 degrees with the exterior face of the first planar part 21 and 75 degrees with the exterior face of the second planar part 23, the 165 degrees may be changed within a range of obtuse angles, and the 75 degrees may also be changed within a range of acute angles.

The first planar part 21 of each metal terminal 20 is connected to each external electrode 12 in a manner facing an end face of the component body 11 in the first direction d1, and a conductive bonding material 30 is used for this connection. Preferably the connection position of each first planar part 21 with respect to each external electrode 12 is such that the center of each external electrode 12 in the third direction d3 corresponds to the center of each first planar part 21 in the third direction d3 (refer to the dashed-dotted line in FIG. 2). Preferably the first-direction dimension D1 [30] of each conductive bonding material 30 is the same, and preferably the connection area with respect to the first planar part 21, and connection area with respect to the external electrode 12, of each conductive bonding material 30, are the same. As mentioned earlier, the first planar part 21 of each metal terminal 20 is constituted by parts of the multiple strip-shaped parts, and therefore the term "conductive bonding material 30" used here refers to all of the multiple bonding material parts present between the parts of the multiple strip-shaped parts constituting the first planar part 21, and the external electrode 12. Also, the term "connection area" used here refers to the areas over which all of the multiple bonding material parts constituting the conductive bonding material 30 contact the first surface part 21 and external electrode 12, respectively, or, in other words, the sum of the areas over which the multiple bonding material parts constituting the conductive bonding material 30 contact the first planar part 21 and external electrode 12, respectively.

Also, the second planar part 23 of each metal terminal 20 is positioned in a manner partially facing, across a clearance 24 (also refer to FIG. 7), one end face (bottom face in FIG. 2) of the component body 11 in the third direction d3, while being fixed to the component body 11 by an adhesive 40 provided in each clearance 24. Preferably the third-direction dimension D3 [24] of each clearance 24 (corresponding to the third-direction dimension D3 [40] of each adhesive 40) is the same, and preferably the connection area with respect to the second planar part 23, and connection area with respect to the component body 11, of each adhesive 40, are the same.

Furthermore, the intermediate planar part 22 of each metal terminal 20 is such that, when the first planar part 21 is connected to each external electrode 12 via the conductive bonding material 30 and the second planar part 23 is partially fixed to the component body 11 via the adhesive 40, it is not in contact with the component body 11 or external electrode 12 of the electronic component 10, and also not in contact with the adhesive 40. Needless to say, the remainder of the second planar part 23 not facing one end face (bottom face in FIG. 2) of the electronic component 10 in the third direction d3 is not in contact with the component body 11 or external electrode 12 of the electronic component 10, either, and also not in contact with the adhesive 40, just like the intermediate planar part 22. In addition, each through hole 22a in the intermediate planar part 22 of each metal terminal 20 is facing the clearance 24 (also refer to FIG. 7) and adhesive 40 in the first direction d1.

For the material of each metal terminal 20, nickel, copper, palladium, platinum, silver, gold, or alloy thereof, etc., may preferably be used. Also, for the material of the conductive bonding material 30, a solder containing two or more metal elements selected from tin, copper, silver, nickel, germanium, gold, antimony, bismuth, zinc, gallium, and indium, or synthetic resin adhesive in which silver grains, gold grains, or other conductive grains have been dispersed to add conductivity, or the like may preferably be used. Furthermore, for the material of the adhesive 40, an adhesive whose primary constituent is epoxy resin, phenol resin, polyimide resin, urea resin, melamine resin, unsaturated polyester resin, bismaleimide resin, polyurethane resin, diaryl phthalate resin, silicone resin, cyanate resin, or other thermosetting synthetic resin, or such adhesive that further contains glass filler or other reinforcing filler, or the like may preferably be used. Furthermore, preferably the adhesive 40 has heat resistance of 180° C. or above.

Figure 6:
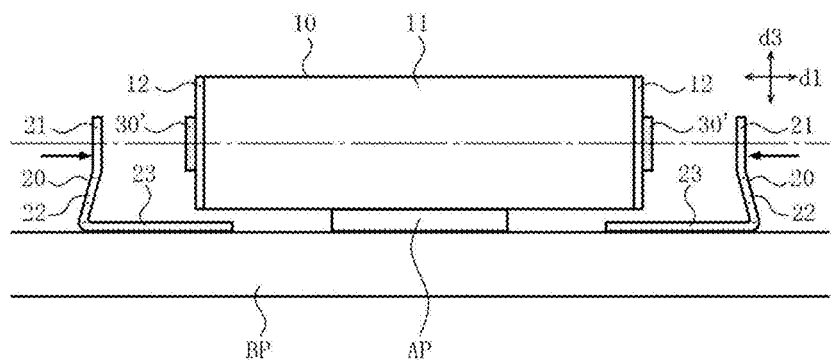
FIG. 6 is a drawing explaining an example of how the electronic component with metal terminals shown in FIG. 1 is produced.
Figure 7:
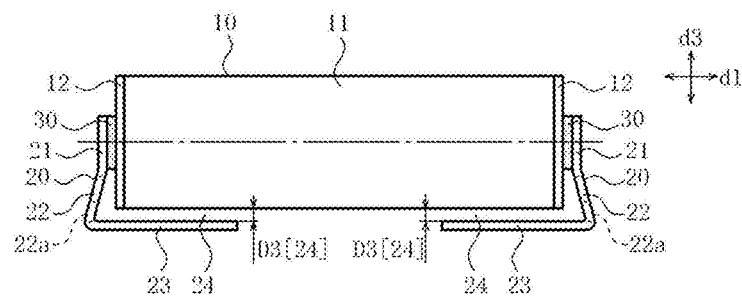
FIG. 7 is a drawing explaining an example of how the electronic component with metal terminals shown in FIG. 1 is produced.

Next, FIGS. 6 and 7 are used to explain an example of how the aforementioned electronic component with metal terminals CWT is produced. The production method explained here is only an example and does not limit in any way how the aforementioned electronic component with metal terminals CWT is produced.

For the production, an electronic component 10 and metal terminals 20 are prepared separately. If the conductive bonding material 30 is solder and the adhesive 40 is thermosetting synthetic resin, then a cream solder 30' is applied to the end faces of the external electrodes 12 of the electronic component 10 in the third direction d3, in a form roughly corresponding to the form of the first planar part 21 of each metal terminal 20 (partial shape of the multiple strip-shaped parts), as shown in FIG. 6. Then, this electronic component 10 is placed on an interval-adjusting member AP placed on the installation face of a base plate BP. The third-direction dimension D3 [AP] of this interval-adjusting member AP is equal to the sum of the third-direction dimension D3 [23] of the second planar part 23 of the metal terminal 20 and the third-direction dimension D3 [24] of the clearance 24.

Then, as shown in FIG. 6, each metal terminal 20 is placed in such a way that the first planar part 21 separates from each external electrode 12 and the second planar part 23 contacts the installation face of the base plate BP. Then, each metal terminal 20 is slid in the direction of the arrow, while keeping it in the aforementioned state, to cause the first planar part 21 of each metal terminal 20 to contact the cream solder 30'. Then, the cream solder 30' is heat-treated, and the first planar part 21 of each metal terminal 20 is connected to each external electrode 12 of the electronic component 10 via the solder 30.

Then, as shown in FIG. 7, the electronic component 10 to which each metal terminal 20 has been connected is removed. Then, a dispenser or other injection equipment is used to inject a paste-type thermosetting synthetic resin into the clearance 24 between a part of the second planar part 23 of each metal terminal 20 and one end face (bottom face in FIG. 7) of the component body 11 in the third direction d3. This injection can be made not only from around the second planar part 23 of each metal terminal 20, but also through the multiple through holes 22a in each metal terminal 20. Then, the injected paste-type thermosetting synthetic resin is heat-treated, and a part of the second planar part 23 of each metal terminal 20 is fixed to the component body 11 via the adhesive 40 (refer to FIG. 2).

It should be noted that, if there is a concern that the position of the electronic component 10 placed on the interval-adjusting member AP may shift during the course of production, then it is preferable to use an interval-adjusting member AP that has positioning projections at its ends in the second direction d2 and/or ends in the first direction d1, and support the ends in the second direction d2 and/or ends in the first direction d1, of the electronic component 10, using these positioning projections. It should also be noted that, if there is a concern that the position of the interval-adjusting member AP placed on the installation face of the base plate BP may shift during the course of production, then it is preferable to use a base plate BP that has two or more positioning projections on its installation face, and support the ends in the second direction d2 and/or ends in the first direction d1, of the interval-adjusting member AP, using these positioning projections.

Figures 8, 9:
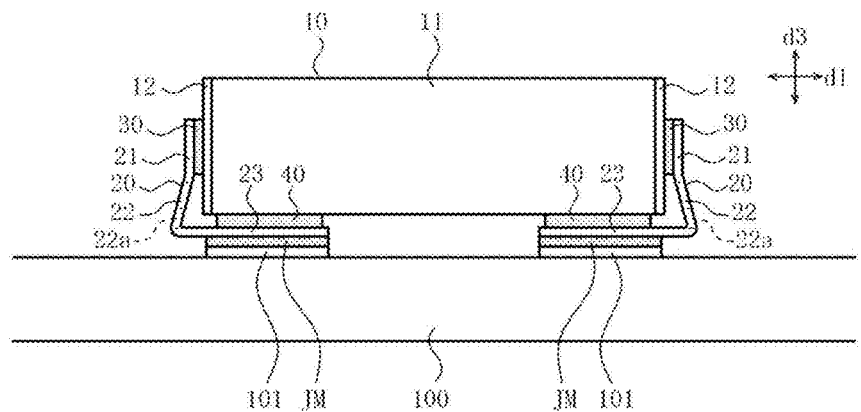
FIG. 8 is a drawing showing the electronic component with metal terminals shown in FIG. 1 as it is mounted on a circuit board.
FIG. 9 is a drawing showing the verified results of effects.

Next, FIG. 8 is used to explain an example of how the electronic component with metal terminals CWT is mounted on a circuit board 100. The mounting method explained here is only an example and does not limit in any way how the electronic component with metal terminals CWT is mounted on a circuit board.

For the mounting, a cream solder is applied onto conductor pads 101 on the circuit board 100 by means of screen printing, etc. Then, the electronic component with metal terminals CWT is installed so that a part of the second planar part 23 of each metal terminal 20 contacts the cream solder. Then, the assembly is put in a reflow furnace to connect a part of the second planar part 23 of each metal terminal 20 to each conductor pad 101 via the solder JM.

Next, the effects achieved by the electronic component with metal terminals CWT are explained.

<Effect 1>

A part of the second planar part 23 of each metal terminal 20 used for mounting on a circuit board 100, is positioned in a manner facing, across a clearance 24 (refer to FIG. 7), one end face (bottom face in FIG. 2) of the component body 11 in the third direction d3, while it is also fixed to the component part 11 via the adhesive 40 provided in this clearance 24. This means that, in a mounted state, the mechanical strength of each metal terminal 20 can be supplemented by the adhesive 40 in a reliable manner and therefore drop in vibration resistance in a mounted state can be minimized, even when an electronic component 10 of large mass is used.

<Effect 2>

Since multiple through holes 22a are provided in the intermediate planar part 22 of each metal terminal 20 in a manner facing the clearance 24 (refer to FIG. 7), a paste-type adhesive (40) can be injected into the clearance 24 by way of these through holes 22a. This means that, even when it is difficult to inject the paste-type adhesive (40) into the areas of the clearance 24 (refer to FIG. 7) facing the intermediate planar part 22 of each metal terminal 20, the paste-type adhesive (40) can be injected in a precise manner into these areas through the multiple through holes 22a in each intermediate planar part 22.

Next, the result of verifying Effect 1 above, with respect to the electronic component with metal terminal CWT, is explained.

In this verification, 10 pieces each of Sample Nos. 1 to 12 of the following specifications were prepared (refer to the "SAMPLE" column in FIG. 9).

<Sample Nos. 1 to 10: Corresponding to Electronic Component with Metal Terminals CWT>

The first direction-dimension D1 [10], second-direction dimension D2 [10], and third-direction dimension D3 [10] of the electronic component 10 are 14 mm, 19 mm, and 4.5 mm, respectively, and the mass of the electronic component 10 is 6.6 g.

The material of each metal terminal 20 is copper, the thickness of each metal terminal 20 is 0.1 mm, and the second-direction dimension D2 [20] of each metal terminal 20 is 8.5 mm.

The third-direction dimension D3 [21] of the first planar part 21 of each metal terminal 20 is 1 mm, and the first-direction dimension D1 [23] of the second planar part 23 of each metal terminal 20 is 3 mm.

The third-direction dimension D3 [22] of the intermediate planar part 22 of each metal terminal 20 increases or decreases according to the third-direction dimension D3 [24] of the clearance 24 (corresponding to the third-direction dimension D3 [40] of the adhesive 40; refer to the "D3 [40]" column in FIG. 9).

The material of each conductive bonding material 30 is epoxy resin in which silver grains have been dispersed to add conductivity, the first-direction dimension D1 [30] of each conductive bonding material 30 is 0.3 mm, and the connection area with respect to the first planar part 21, and connection area with respect to the external electrode 12, of each conductive bonding material 30, are 4 mm$^2$.

The material of each adhesive 40 is epoxy resin, the third-direction dimension D3 [40] of each adhesive 40 increases or decreases according to the third-direction dimension D3 [24] of the clearance 24 (refer to the "D3 [40]" column in FIG. 9), and the connection area with respect to the second planar part 22, and connection area with respect to the component body 11, of each adhesive 40, are 17 mm$^2$.

<Sample No. 11: Not Corresponding to Electronic Component with Metal Terminals CWT>

This sample was the same as Sample No. 4, except that the adhesive 40 is not used.

<Sample No. 12: Not Corresponding to Electronic Component with Metal Terminals CWT>

This sample was the same as Sample No. 7, except that the adhesive 40 is not used.

For the verification, test pieces (total 1,200 pieces; refer to FIG. 8) were prepared by mounting 100 pieces each of Sample Nos. 1 to 12 on circuit boards of the same specifications under the same conditions, after which the vibration resistance test described below was conducted on each of the test pieces and the test results were checked. The "Vibration Resistance Failure" column in FIG. 9 indicates how many of the 100 test pieces failed the vibration resistance test in the format of n/100.

The method of the vibration resistance test is described below. To be specific, sine-wave vibration was applied to each of the total 1,200 test pieces using the vibration tester i-220 manufactured by IMV Corporation, at an acceleration of 98 m/s$^2$ and under conditions where the frequency doubled (or halved) in 1 minute in a range of 20 to 2000 Hz, for 100 million times each in the first direction d1, second direction d2, and third direction d3.

The "Vibration Resistance Failure" field in FIG. 9 shows that, among Sample Nos. 1 to 10 corresponding to the electronic component with metal terminals CWT, a small number of test pieces of Sample Nos. 1 and 10 failed by at least one adhesive 40 separating from the capacitor body 11 or from the second planar part 23 of the metal terminal 20. On the other hand, a large number of Sample Nos. 11 and 12 not corresponding to the electronic component with metal terminals CWT failed by at least one metal terminal detaching from the external electrode of the electronic component or from the conductor pad on the circuit board.

As is evident from the "Vibration Resistance Failure" counts of Sample Nos. 1 to 10, and from the "Vibration Resistance Failure" counts of Sample Nos. 11 and 12, as indicated in FIG. 9, Sample Nos. 1 to 10 corresponding to the electronic component with metal terminals CWT have far superior vibration resistance compared to Sample Nos. 11 and 12 not corresponding to the electronic component with metal terminals CWT.

Also, among Sample Nos. 1 to 10 corresponding to the electronic component with metal terminals CWT, Sample Nos. 2 to 9 have better vibration resistance compared to Sample Nos. 1 and 10. Although it cannot be said with certainty, a test piece of Sample No. 1 failed probably because the third-direction dimension D3 [40] of the adhesive 40 was greater than other samples, while test pieces of Sample No. 10 failed probably because the third-direction dimension D3 [40] of the adhesive 40 was smaller than other samples.

In addition, it is presumed that the clearance between the first planar parts 21 of the two metal terminals 20 facing each other in the first direction d1 in FIG. 8, or alternatively, the first direction-dimension D1 [10] of the electronic component 10, is also part of the reason why test pieces of Sample Nos. 1 and 10 failed. This is because when the first-direction dimension D1 [10] of the electronic component 10 is small, the vibration resistance should surely be better. In this point, it can be said that, for Sample Nos. 1 to 10, the vibration resistance can be improved further so long as the value in the "Third-Direction Dimension D3 [40]/ First-Direction Dimension D1 [10]" column is $^{24}/_{1,000}$ or smaller, or more preferably $^{1}/_{1,000}$ or greater and $^{24}/_{1,000}$ or smaller.

Next, FIGS. 10 to 12 are used to explain variation examples of the metal terminals 20 in the electronic component with metal terminals CWT.

FIRST VARIATION EXAMPLE

Figure 10A:
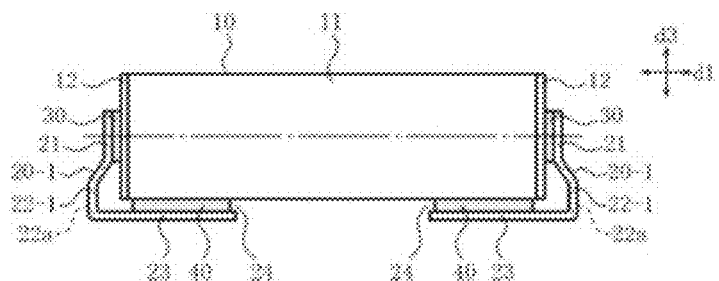
FIGS. 10A and 10B are drawings corresponding to FIGS. 2 and 3, respectively, illustrating the first variation example of the metal terminals shown in FIG. 1.
Figure 10B:
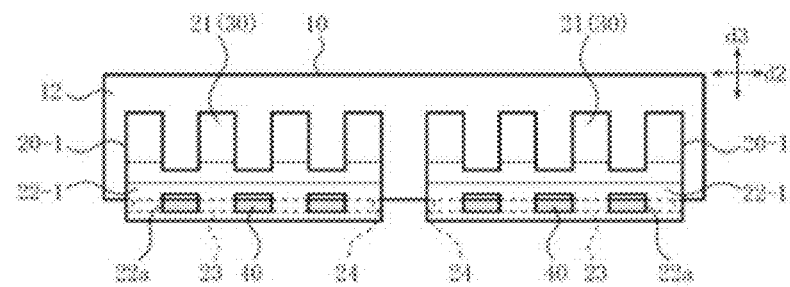

A metal terminal 20-1 shown in FIGS. 10A and 10B is different from the metal terminal 20 in the following point:
An intermediate planar part 22-1 continuously has a first part (not accompanied by symbol) whose exterior face forms an obtuse angle with the exterior face of the first planar part 21, and a second part (not accompanied by symbol) whose exterior face forms roughly right angles with the exterior face of the second planar part 23, in the third direction d3.

The other constitutions of the metal terminal 20-1 are the same as the corresponding constitutions of the metal terminal 20, and are therefore denoted by the same symbols and not explained.

It should be noted that, while the intermediate planar part 22-1 shown in FIG. 10A has the exterior face of its first part forming an angle of 150 degrees with the exterior face of the first planar part 21, and the exterior face of its second part forming an angle of 90 degrees with the exterior face of the second planar part 23, the 150 degrees may be changed within a range of obtuse angles and the 90 degrees may also be changed to a different angle close thereto.

SECOND VARIATION EXAMPLE

Figure 11A:
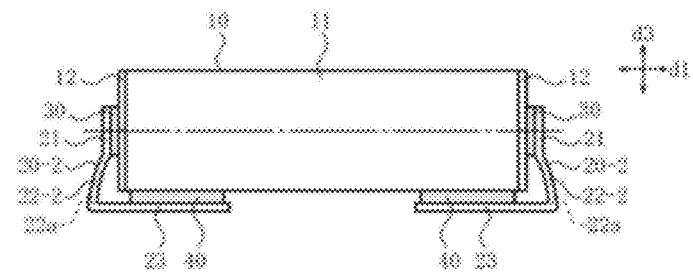
FIGS. 11A and 11B are drawings corresponding to FIGS. 2 and 3, respectively, illustrating the second variation example of the metal terminals shown in FIG. 1.
Figure 11B:
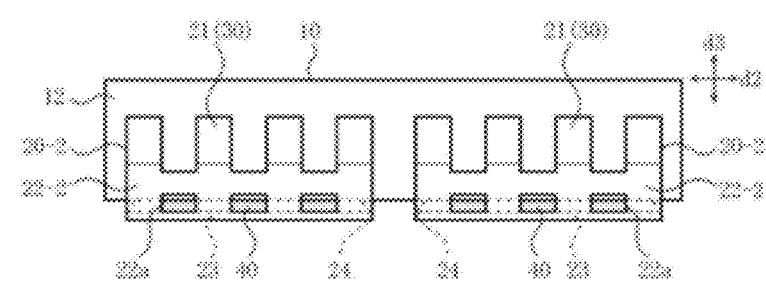

A metal terminal 20-2 shown in FIGS. 11A and 11B is different from the metal terminal 20 in the following point:
An intermediate planar part 22-2 is warped in such a way that its exterior face forms a convex surface.

The other constitutions of the metal terminal 20-2 are the same as the corresponding constitutions of the metal terminal 20, and are therefore denoted by the same symbols and not explained.

It should be noted that, while the intermediate planar part 22-2 shown in FIG. 11A is warped to a small degree, the degree of warpage may be increased beyond what is shown in the figure.

THIRD VARIATION EXAMPLE

Figure 12A:
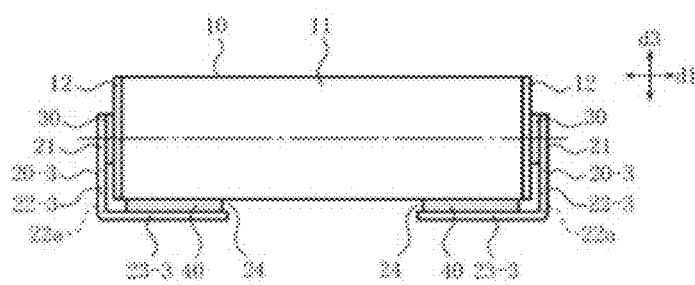
FIGS. 12A and 12B are drawings corresponding to FIGS. 2 and 3, respectively, illustrating the third variation example of the metal terminals shown in FIG. 1.
Figure 12B:
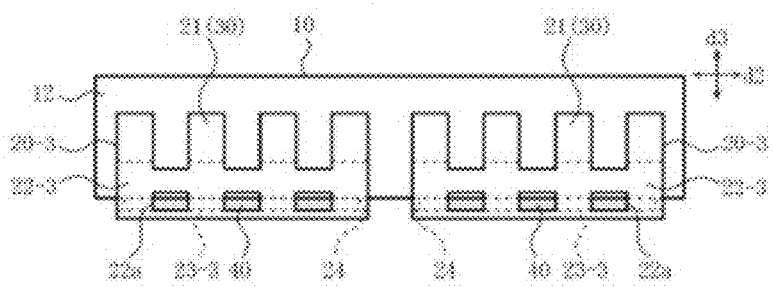

A metal terminal 20-3 shown in FIGS. 12A and 12B is different from the metal terminal 20 in the following points:
An intermediate planar part 22-3 continues from the first planar part 21 without bending, and its exterior face forms roughly right angles with the exterior face of a second planar part 23-3.
Based on the shape of the intermediate planar part 22-3, the first-direction dimension D1 [23-3] of the second planar part 23-3 is smaller than the first-direction dimension D1 [23] of the second planar part 23 of the metal terminal 20.

The other constitutions of the metal terminal 20-3 are the same as the corresponding constitutions of the metal terminal 20, and are therefore denoted by the same symbols and not explained.

Next, other variation examples of the electronic component with metal terminals CWT are explained.

OTHER VARIATION EXAMPLE 1

While the metal terminal 20 (20-1 to 20-3) shown was formed by bending a metal plate constituted continuously by multiple (four in the figure) strip-shaped parts and a rectangular part, the number of strip-shaped parts is not limited in any way, and the second-direction dimension D2 [20 (20-1 to 20-3)] of the metal terminal 20 (20-1 to 20-3) is not limited in any way, either. Also, while the first planar part 21 of each metal terminal 20 shown was constituted by parts of the multiple strip-shaped parts, a metal terminal may be formed by bending a rectangular metal plate in the same manner and one end of it may be used as the first planar part, with the other end used as the second planar part.

OTHER VARIATION EXAMPLE 2

While the electronic component 10 shown had sets of two metal terminals 20 (20-1 to 20-3) provided at an interval between constituents of the sets in the second direction d2 on each external electrode 12, the number of metal terminals 20 (20-1 to 20-3) provided on each external electrode 12 is not limited in any way. For example, only one metal terminal 20 (20-1 to 20-3) may be provided on each external electrode 12 of the electronic component 10, so long as a metal terminal 20 (20-1 to 20-3) whose second-direction dimension D2 [20 (20-1 to 20-3)] has been increased is used, as explained in <Other Variation Example 1>. On the other hand, three or more metal terminals 20 (20-1 to 20-3) may be provided on each external electrode 12 of the electronic component 10, so long as metal terminals 20 (20-1 to 20-3) whose second-direction dimension D2 [20 (20-1 to 20-3)] has been decreased are used. The same applies when each metal terminal is formed by bending a rectangular metal plate in the same manner, as explained in <Other Variation Example 1>.

OTHER VARIATION EXAMPLE 3

While the electronic component 10 of the electronic component with metal terminals CWT shown was a multilayer capacitor, the present invention may also be applied to any other electronic component with metal terminals constituted by providing metal terminals on an electronic component other than a multilayer capacitor, such as a multi-layer varistor or multi-layer inductor, so long as the electronic component has a component body of roughly rectangular solid shape that contains internal conductors, as well as external electrodes provided on the opposing ends of the component body, respectively.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-030744, filed Feb. 22, 2017, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. An electronic component with metal terminals, constituted by an electronic component on which metal terminals are provided, wherein:
   the electronic component has a component body of roughly rectangular solid shape that contains internal conductors, and external electrodes provided on opposing ends of the component body, respectively;
   each of the metal terminals has a first planar part and a second planar part oriented differently from the first planar part;
   the first planar part of the metal terminal is connected to one of the external electrodes via a conductive bonding material provided in between in a manner facing one face of the component body; and
   the second planar part of the metal terminal is positioned in a manner facing at least partially, across a clearance in closest proximity, another face adjoining the one face of the component body, while being fixed to the component body by an adhesive provided in the clearance,
   wherein the metal terminal is provided only on the one face and the another face of the component body, among all of the faces of the component body, and the adhesive and the conductive bonding material are constituted by different materials, and a thickness of the adhesive is greater than a thickness of the conductive bonding material.

2. The electronic component with metal terminals according to claim 1, wherein the first planar part of the metal terminal is connected to the external electrode via a conductive bonding material.

3. The electronic component with metal terminals according to claim 1, wherein:
   the metal terminal has an intermediate planar part between the first planar part and the second planar part; and
   the intermediate planar part of the metal terminal is not in contact with the external electrode nor component part, and also not in contact with the adhesive.

4. The electronic component with metal terminals according to claim 3, wherein through holes facing the clearance are provided in the intermediate planar part.

5. The electronic component with metal terminals according to claim 1, wherein the clearance between the second planar part of the metal terminal and the component body is 24/1,000 or smaller of a dimension of the electronic component along a direction in which the external electrodes are facing each other.

6. The electronic component with metal terminals according to claim 1, wherein the adhesive has heat resistance of 180° C. or above.

7. The electronic component with metal terminals according to claim 1, wherein the electronic component is a multilayer capacitor.

8. The electronic component with metal terminals according to claim 1, wherein the adhesive is constituted by a resin.

9. An electronic component with metal terminals, constituted by an electronic component on which metal terminals are provided, wherein:
   the electronic component has a component body of roughly rectangular solid shape that contains internal conductors, and external electrodes provided on opposing ends of the component body, respectively;
   each of the metal terminals has a first planar part and a second planar part oriented differently from the first planar part;
   the first planar part of the metal terminal is connected to one of the external electrodes in a manner facing one face of the component body; and
   the second planar part of the metal terminal is positioned in a manner facing at least partially, across a clearance, another face adjoining the one face of the component body, while being fixed to the component body by an adhesive provided in the clearance,
   wherein the metal terminal has an intermediate planar part between the first planar part and the second planar part, wherein the intermediate planar part of the metal terminal is not in contact with the external electrode nor component part, and also not in contact with the adhesive, and an exterior face of the intermediate planar part forms an obtuse angle with an exterior face of the first planar part.

* * * * *